United States Patent
Sim

(10) Patent No.: US 7,719,308 B2
(45) Date of Patent: May 18, 2010

(54) SEMICONDUCTOR APPARATUS, ON-DIE TERMINATION CIRCUIT, AND CONTROL METHOD OF THE SAME

(75) Inventor: Su-Jeong Sim, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/179,496

(22) Filed: Jul. 24, 2008

(65) Prior Publication Data

US 2009/0121741 A1 May 14, 2009

(30) Foreign Application Priority Data

Nov. 12, 2007 (KR) .................. 10-2007-0114946

(51) Int. Cl.
*H03K 19/003* (2006.01)
(52) U.S. Cl. .......................... 326/30; 326/82
(58) Field of Classification Search .................. 326/26, 326/27, 30, 82–87
See application file for complete search history.

(56) References Cited

U.S. PATENT DOCUMENTS

| 7,288,959 | B1 | 10/2007 | Lee |
| 7,372,294 | B2 * | 5/2008 | Kim ........................ 326/30 |
| 2007/0146004 | A1 | 6/2007 | Park et al. |
| 2008/0001624 | A1 | 1/2008 | Lee |
| 2008/0074138 | A1 | 3/2008 | Lee |
| 2008/0074140 | A1 | 3/2008 | Park |

FOREIGN PATENT DOCUMENTS

| JP | 2007-179725 | 7/2007 |
| KR | 100575006 B1 | 4/2006 |

* cited by examiner

*Primary Examiner*—Don P Le
(74) *Attorney, Agent, or Firm*—Baker & McKenzie LLP

(57) ABSTRACT

An on-die termination circuit of a semiconductor apparatus can include: a code converting unit configured to change a code value of a termination code in response to a termination control signal; and a plurality of on-die termination blocks configured to commonly receive the termination code, and perform a termination operation.

21 Claims, 5 Drawing Sheets

FIG.5

| res_cke | half_term | shift<1> | shift<0> | ODT |
|---|---|---|---|---|
| H | L | H | L | 240ohm |
| H | H | L | H | 120ohm |
| L | L | L | H | 120ohm |
| L | H | L | L | 60ohm |

| ODT | BCODE<0:6> | | | | | | |
|---|---|---|---|---|---|---|---|
| 60ohm | 1 | 1 | 0 | 1 | 0 | 0 | 0 |
| 120ohm (1bit shift) | 0 | 1 | 1 | 0 | 1 | 0 | 0 |
| 240ohm (2bit shift) | 0 | 0 | 1 | 1 | 0 | 1 | 0 |

SEMICONDUCTOR APPARATUS, ON-DIE TERMINATION CIRCUIT, AND CONTROL METHOD OF THE SAME

CROSS-REFERENCES TO RELATED APPLICATION

The present application claims priority under 35 U.S.C. 119(a) to Korean application number 10-2007-0114946, filed on Nov. 12, 2007, the content of which is incorporated herein in its entirety by reference as if set forth in full.

BACKGROUND

1. Technical Field

The embodiments described herein relate to a semiconductor apparatus, and more particularly, to an on-die termination circuit of a semiconductor apparatus and a control method of the same.

2. Related Art

In general, when signals transmitted through a bus line having predetermined impedance are input to another bus line having different impedance, a signal loss occurs. Therefore, impedance needs to match between the two bus lines in order to reduce the signal loss, which is called on-die termination.

As shown in FIG. 1, an on-die termination apparatus according to the related art includes a plurality of on-die termination blocks 10.

The number of on-die termination blocks 10 may be determined according to the number of input signals to a semiconductor apparatus. For example, if the number of input signals is sixteen, the number of on-die termination blocks 10 is also correspondingly sixteen.

Each of the on-die termination blocks 10 includes a plurality of drivers. Each of the drivers has a fixed resistance value such as 60Ω, 120Ω, or 240Ω. An offset of the resistance value of each driver is compensated by a termination code "CODE<0:4>."

The resistance value of the on-die termination block may be selected by selectively operating the plurality of drivers.

The above-mentioned on-die termination circuit of the semiconductor apparatus, according to the related art, includes a large number of drivers in order to implement various resistance values. In particular, since the drivers having the resistance values 120Ω and 240Ω occupy areas larger than the driver having 60Ω, the area of a data output driving circuit in the semiconductor apparatus increases, resulting in a reduction in layout margin.

SUMMARY

A semiconductor apparatus, an on-die termination circuit of a semiconductor apparatus, and a control method of the same are described herein.

In one aspect, an on-die termination circuit of a semiconductor apparatus can include a code converting unit that can be configured to change a code value of a termination code in response to a termination control signal, and a plurality of on-die termination blocks that can be configured to commonly receive the termination code and perform a termination operation.

According to another aspect, a semiconductor apparatus can include a code converting unit that can be configured to output a second code obtained by varying the number of bits of a first code in response to a termination control signal a plurality of first on-die termination blocks that can be configured to commonly receive the second code and perform a termination operation and a code recovering unit that can be configured to convert the second code into the first code in response to the termination control signal and outputs the first code to a plurality of second on-die termination blocks.

According to still another aspect, there is provided a method of controlling an on-die termination circuit of a semiconductor apparatus. The method can include generating a second code by varying a code value of a first code according to a termination control signal, setting the resistance values of a plurality of first on-die termination blocks using the second code, recovering the second code to the first code according to the termination control signal, and setting the resistance values of a plurality of second on-die termination blocks using the first code.

These and other features, aspects, and embodiments are described below in the section entitled "Detailed Description."

BRIEF DESCRIPTION OF THE DRAWINGS

Features, aspects, and embodiments are described in conjunction with the attached drawings, in which:

FIG. 5 is a diagram illustrating the operation of the code converting unit of the on-die termination circuit shown in FIG. 2, in accordance with one embodiment.

DETAILED DESCRIPTION

An on-die termination circuit of a semiconductor apparatus configured in accordance with the embodiments described here can make it possible to acquire various resistance values with significantly smaller drivers than possible with conventional circuits, and thus a corresponding layout area can be reduced. Further, since the number of drivers decreases, it is possible to reduce parasitic capacitance generated in duplicated resistor components and transistor components due to a large number of drivers.

Figure 1:
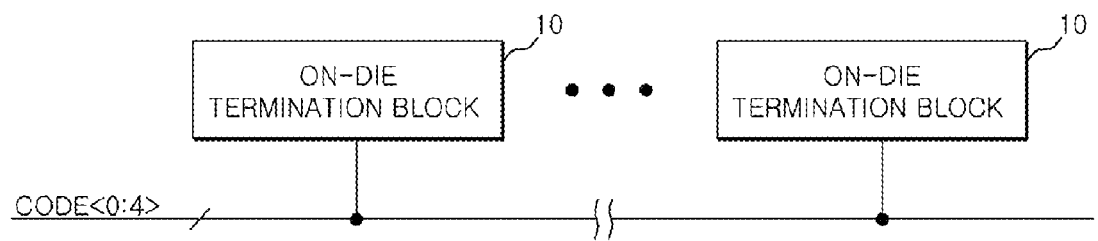
FIG. 1 is a block diagram illustrating an on-die termination circuit of a conventional semiconductor apparatus.
Figure 2:
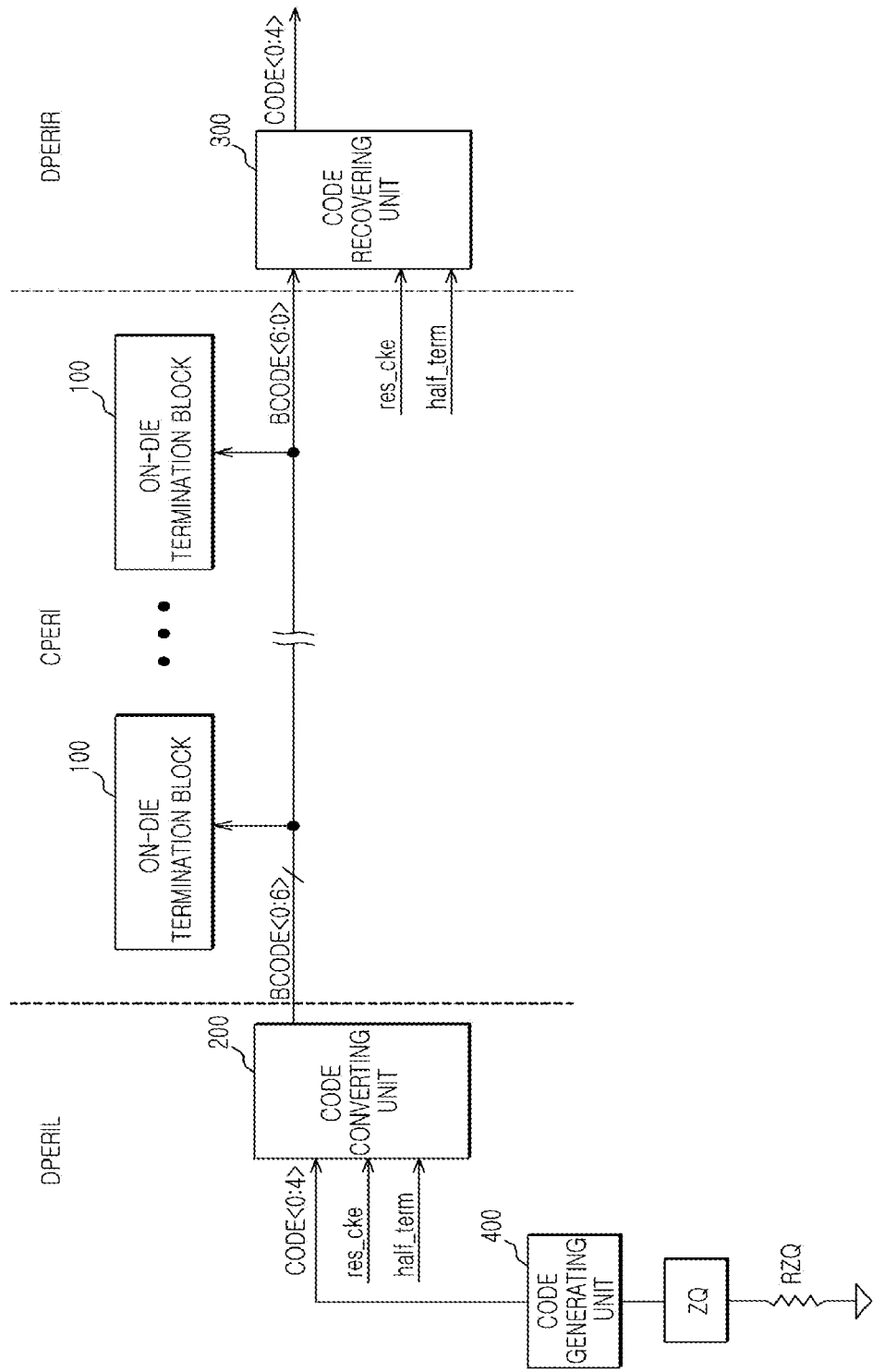
FIG. 2 is a block diagram illustrating an on-die termination circuit of a semiconductor apparatus, in accordance with one embodiment.

As shown in FIG. 2, an on-die termination circuit 101 of a semiconductor apparatus, configured in accordance with one example embodiment, can include a plurality of on-die termination blocks 100, a code converting unit 200, a code recovering unit 300, and a code generating unit 400.

The code converting unit 200 and the code recovering unit 300 can be provided in a peripheral circuit area for processing data. The peripheral circuit area for processing the data can be divided into a left peripheral circuit area DPERIL and a right peripheral circuit area DPERIR. In one embodiment, the code converting unit 200 can be provided in the left peripheral circuit area DPERIL and the code recovering unit 300 can be provided in the right peripheral circuit area DPERIR. The on-die termination blocks 100 can be provided in a central peripheral circuit area CPERI for processing a command or an address.

A signal line for transmitting a second code "BCODE<0: 6>" from the code converting unit 200 to the code recovering unit 300 via the central peripheral circuit area CPERI is formed, and the plurality of on-die termination blocks 100 can commonly receive the second code "BCODE<0:6>" through the signal line.

A termination code "CODE<0:4>" generated by the code generating unit 400 is referred to as a first code "CODE<0:4>." The second code "BCODE<0:6>" can be a code formed by shifting the first code "CODE<0:4>" with the code converting unit 200. The code generating unit 400 can be provided with a copy driver acquired by copying a data input/output driver having a resistance value determined according to an input code. Therefore, the code generating unit 400 can be configured to generate the first code "CODE<0:4>" so that resistance values of an external resistor RZQ and the copy driver connected to each other through a pin ZQ are equal to each other.

Although not shown in FIG. 2, the plurality of on-die termination blocks can also be provided in the right peripheral circuit area DPERIR. Since the plurality of on-die termination blocks provided in the right peripheral circuit area can be configured to operate at a fixed resistance value, the plurality of on-die termination blocks need to receive the first code "CODE<0:4>." The on-die termination blocks 100 provided in the central peripheral circuit area CPERI have a circuit configuration different from the on-die termination blocks 100 provided in the left peripheral circuit area DPERIL. Accordingly, the on-die termination blocks 100 provided in the right peripheral circuit area DPERIR and the on-die termination blocks provided in the left peripheral circuit area DPERIL can be referred to as a first on-die termination block and a second on-die termination block, respectively.

The plurality of on-die termination blocks 100 can be configured to commonly receive the second code "BCODE<0:6>" and perform an on-die termination operation with a variable resistance value.

The code converting unit 200 can be configured to generate the second code "BCODE<0:6>" by shifting the first code "CODE<0:4>" by the number of bits determined according to a combination of a termination control signal, that is, a system stabilization signal "res_cke" and a half termination signal "half_term."

The code recovering unit 300 can be configured to shift the second code "BCODE<0:6>" received in a reverse order by the number of the bits determined according to the combination of the system stabilization signal "res_cke" and the half termination signal "half_term" to recover the first code "CODE<0:4>."

Figure 3:
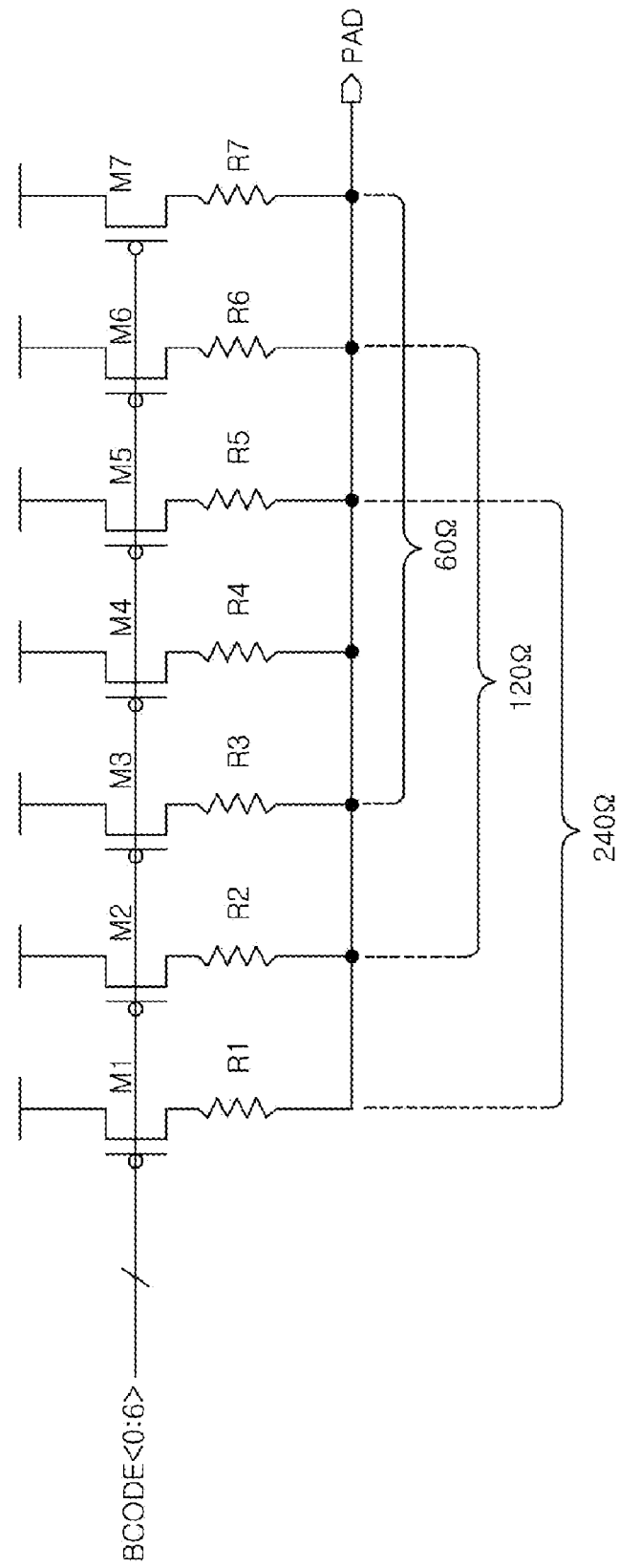
FIG. 3 is a circuit diagram illustrating a variable driver of the on-die termination block shown in FIG. 2, in accordance with one embodiment.

As shown in FIG. 3, the on-die termination block 100 can be equipped with a variable driver 110. An output terminal of the on-die terminal block 100 can be connected to a pad PAD, for example, a command or address input pad.

The variable driver 110 can select one resistance value among 60Ω, 120Ω, or 240Ω according to the second code "BCODE<0:6>."

The variable driver 110 can include first to seventh transistors M1 to M7 connected to a power supply terminal and first to seventh resistors R1 to R7 connected between the first to seventh transistors M1 to M7 and the output terminal. The first to seventh transistors M1 to M7 can be arranged so that the widths of the transistors can increase by a predetermined ratio, for example, increase two times as much or decrease by half. The first to seventh resistors R1 to R7 can be arranged so that the sizes of the resistors can increase two times as much or decrease by half. The third to seventh transistors M3 to M7 and the third to seventh resistors R3 to R7 can be selected according to the second code "BCODE<0:6>" generated without shifting the first code "CODE<0:4>." Therefore, the pull-up variable driver 110 can have a resistance value of 60Ω. The second to sixth transistors M2 to M6 and the second to sixth resistors R2 to R6 can be selected according to the second code "BCODE<0:6>" generated by shifting the first code "CODE<0:4>" by one bit. Therefore, the pull-up variable driver 110 can have a resistance of 120Ω. The first to fifth transistors M1 to M5 and the first to fifth resistors R1 to R5 can be selected according to the second code "BCODE<0:6>" generated by shifting the first code "CODE<0:4>" by two bits. Therefore, the pull-up variable driver 110 can have a resistance of 240Ω.

Figure 4:
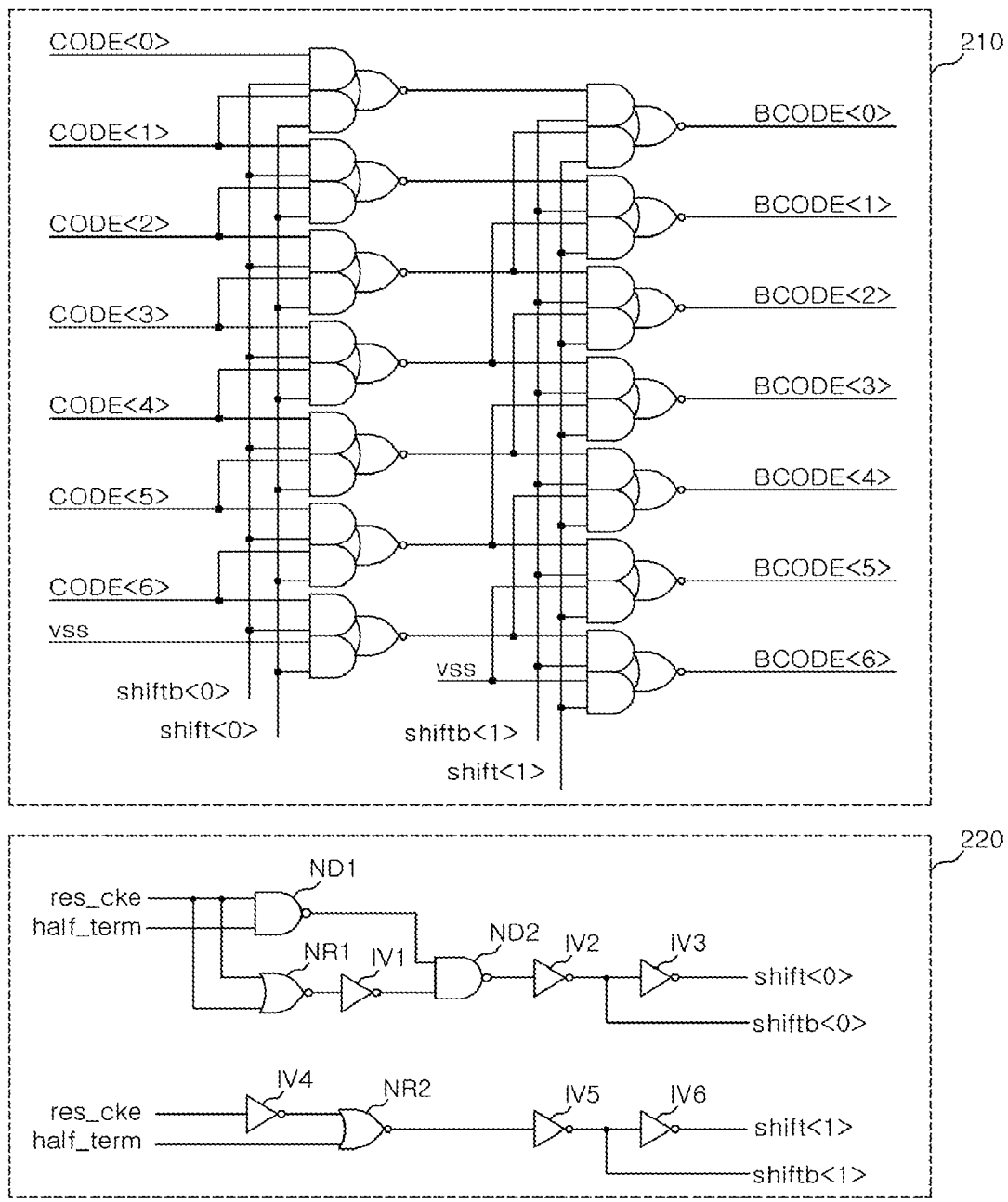
FIG. 4 is a circuit diagram of a code converting unit of the on-die termination circuit shown in FIG. 2, in accordance with one embodiment.

As shown in FIG. 4, the code converting unit 200 can be equipped with a code shifting logic 210 and a control logic 220. The code shifting logic 210 can be configured to generate the second code "BCODE<0:6>" by shifting the first code "CODE<0:4>" by the number of bits corresponding to shift control signals "shift<0:1>" and "shiftb<0:1>." The control logic 220 can be configured to generate the shift control signals "shift<0:1>" and "shiftb<0:1>" according to the combination of the termination control signal, that is, the system stabilization signal "res_cke" and the half termination signal "half_term." The first code "CODE<0:4>" is 5 bits, while an input terminal "CODE<0:6>" of the code shifting logic 210 is 7 bits. Accordingly, input terminals CODE<5> and CODE<6> can be fixed at a low level using a method of connecting the input terminals to a ground terminal.

The code shifting logic 210 is constituted of a coder shifter and may be constituted of a barrel shifter. The code shifting logic 210 can be configured to output an input code without shifting the input code when all the shift control signals "shift<0:1>" are at the low level. The code shifting logic 210 can be configured to output the input code by shifting the input code by one bit when the shift control signals "shift<0:1>" are at a high level and the low level. The code shifting logic 210 can be configured to output the input code by shifting the input code by two bits when the shift control signals "shift<0:1>" are at the low level and the high level.

The control logic 220 can include first and second NAND gates ND1 and ND2, first and second NOR gates NR1 and NR2, and first to sixth inverters IV1 to IV6. A circuit of the control logic 220 can be configured on the basis of a truth table shown at an upper part of FIG. 5.

The code recovering unit 300 can be configured in the same manner as the code converting unit 200 shown in FIG. 4 except for receiving the reverse second code "BCODE<6:0>." The reverse second code "BCODE<6:0>" can have the same value as the first code "CODE<0:4>" by shifting the reverse second code "BCODE<6:0>" by the number of bits shifted in the code converting unit 200.

The operation of the on-die termination circuit of the semiconductor apparatus will be now described, in accordance with one embodiment.

The code converting unit 200 can be configured to generate the second code "BCODE<0:6>" by shifting the first code "CODE<0:4>" by the number of bits corresponding to the shift control signals "shift<0:1>" and "shiftb<0:1>" generated according to the combination of the system stabilization signal "res_cke" and the half termination signal "half_term."

The half termination signal "half_term" is for determining an increase and a decrease of the resistance value of the on-die termination block 100 and the system stabilization signal "res_cke" can be for determining a resistance value adjusting range. That is, the half termination signal "half_term" can be activated in order to decrease the resistance value of the on-die termination block 100, and the half termination signal "half_term" can be deactivated in order to increase the resistance value of the on-die termination block 100. Meanwhile, the system stabilization signal "res_cke" can be activated in order to select the resistance value of the on-die termination block between 120Ω and 240Ω and the system stabilization signal "res_cke" can be deactivated in order to select the resistance value of the on-die termination block 100 between 120Ω and 60Ω.

As shown in FIG. 5, when the system stabilization signal "res_cke" and the half termination signal "half_term" are at the low level and the high level, respectively, all the shift control signals "shift<0:1>" can be output at the low level.

When all the shift control signals "shift<0:1>" are output at the low level, the code shifting logic 210 shown in FIG. 4 can be configured to generate the second code "BCODE<0:6>" without shifting the first code "CODE<0:4>." The resistance value of the on-die termination block 100 receiving the second code "BCODE<0:6>" which is not shifted can be set to 60Ω.

As shown in FIG. 5, when both the system stabilization signal "res_cke" and the half termination signal "half_term" are at the low level or the high level, respectively, the shift control signals "shift<0:1>" can be output at the high level and in the low level, respectively.

When the shift control signals "shift<0:1>" are output at the high level and the low level, respectively, the code shifting logic 210 shown in FIG. 4 can be configured to generate the second code "BCODE<0:6>" by shifting the first code "CODE<0:4>" by one bit. The resistance value of the on-die termination block 100 receiving the second code "BCODE<0:6>" shifted by one bit can increase to 120Ω.

As shown in FIG. 5, when the system stabilization signal "res-cke" and the half termination signal "half_term" are at the high level and the low level, respectively, the shift control signals "shift<0:1>" can be output at the low level and the high level, respectively.

When the shift control signals "shift<0:1>" are output at the low level and the high level, respectively, the code shifting logic 210 shown in FIG. 4 can be configured to generate the second code "BCODE<0:6>" by shifting the first code "CODE<0:4>" by two bits. The resistance value of the on-die termination block 100 receiving the second code "BCODE<0:6>" shifted by two bits can increase to 240Ω.

As described above, the plurality of on-die termination blocks 100 can be configured to perform the termination operations for a command or address signal according to a predetermined resistance value.

Meanwhile, the code recovering unit 300 can be configured to recover the first code "CODE<0:4>" by shifting the second code "BCODE<0:6>" received in a reverse order by the number of bits shifted by the code converting unit 200 and output the recovered first code "CODE<0:4>" to the plurality of on-die termination blocks provided in the right peripheral circuit area DPERIR shown in FIG. 3.

The plurality of on-die termination blocks provided in the right peripheral circuit area DPERIR can be configured to perform the termination operation with a fixed resistance value according to the recovered first code "CODE<0:4>."

It will be apparent to those skilled in the art that various modifications and changes may be made without departing from the scope and spirit of the embodiments described herein. Therefore, it should be understood that the above embodiments are not limitative, but illustrative in all aspects. The scope of the above embodiments are defined by the appended claims rather than by the description preceding them, and therefore all changes and modifications that fall within metes and bounds of the claims, or equivalents of such metes and bounds are therefore intended to be embraced by the claims.

What is claimed is:

1. An on-die termination circuit of a semiconductor apparatus, comprising:

a code converting unit configured to change a code value of a termination code in response to a termination control signal; and a plurality of on-die termination blocks configured to commonly receive the termination code and perform a termination operation, wherein the plurality of on-die termination blocks are coupled to a plurality of input pads respectively.

2. The on-die termination circuit of claim 1, wherein the code converting unit includes a code shifter configured to shift the termination code by a predetermined number of bits.

3. The on-die termination circuit of claim 2, wherein the code shifter includes:

a code shifting logic configured to shift the termination code by the number of bits corresponding to a shift control signal; and a control logic configured to generate the shift control signal according to the termination control signal.

4. The on-die termination circuit of claim 3, wherein the code shifting logic includes a barrel shifter.

5. The on-die termination circuit of claim 3, wherein the control logic generates the shift control signal using the termination control signal, that is, a system stabilization signal input from the outside and a half termination signal for controlling a variation of the resistance value of the on-die termination block.

6. The on-die termination circuit of claim 1, wherein the on-die termination block includes a variable driver that has any one of a plurality of resistance values according to the termination code output from the code converting unit.

7. A semiconductor apparatus comprising:

a code converting unit configured to output a second code obtained by varying the number of bits of a first code in response to a termination control signal;

a plurality of first on-die termination blocks configured to commonly receive the second code and perform a termination operation; and a code recovering unit that converts the second code into the first code in response to the termination control signal and outputs the first code to a plurality of second on-die termination blocks.

8. The semiconductor apparatus of claim 7, wherein the code converting unit includes a code shifter.

9. The semiconductor apparatus of claim 8, wherein the code shifter includes:

a code shifting logic configured to shift the first code by a number of bits corresponding to a shift control signal; and a control logic configured to generate the shift control signal according to the termination control signal.

10. The semiconductor apparatus of claim 9, wherein the code shifting logic includes a barrel shifter.

11. The semiconductor apparatus of claim 7, wherein the plurality of first on-die termination blocks include a variable driver that has any one of a plurality of resistance values according to the second code output from the code converting unit.

12. The semiconductor apparatus of claim 7, wherein the code recovering unit includes a code shifter.

13. The semiconductor apparatus of claim 12,
wherein the code shifter includes:
a code shifting logic configured to receive the second code and shifts the received second code by a number of bits corresponding to the shift control signal; and
a control logic configured to generate the shift control signal according to the termination control signal.

14. The semiconductor apparatus of claim 13,
wherein the code shifting logic includes a barrel shifter.

15. The semiconductor apparatus of claim 7,
wherein the plurality of first on-die termination blocks are provided in a peripheral circuit area for processing a command or an address.

16. The semiconductor apparatus of claim 7,
wherein the code converting unit and the code recovering unit are provided in a peripheral circuit area for processing data.

17. A method of controlling an on-die termination circuit of a semiconductor apparatus, the method comprising:
generating a second code by varying a code value of a first code according to a termination control signal;
setting the resistance values of a plurality of first on-die termination blocks using the second code;
recovering the second code to the first code according to the termination control signal; and
setting the resistance values of a plurality of second on-die termination blocks using the first code.

18. The method of claim 17,
wherein the generating of the second code includes shifting the first code by a predetermined number of bits.

19. The method of claim 18,
wherein the recovering of the second code to the first code includes shifting the second code in a reverse order by a predetermined number of bits.

20. The method of claim 17,
wherein the setting of the resistance values of the first on-die termination blocks includes selecting any one of the plurality of resistance values according to the second code.

21. The method of claim 17,
wherein the termination control signal includes a system stabilization signal input from the outside and a half termination signal for controlling the variation of the resistance values of the first on-die termination blocks.

* * * * *